(12) United States Patent
Yoshihara et al.

(10) Patent No.: US 8,339,238 B2
(45) Date of Patent: Dec. 25, 2012

(54) RESISTIVE SHEET, PRESSURE-SENSITIVE SWITCH, AND INPUT DEVICE

(75) Inventors: Satoshi Yoshihara, Hyogo (JP); Masaki Sawada, Osaka (JP); Hisanori Kusunoki, Osaka (JP); Hiroto Inoue, Kyoto (JP)

(73) Assignee: Panasonic Corporation, Osaka (JP)

( * ) Notice: Subject to any disclaimer, the term of this patent is extended or adjusted under 35 U.S.C. 154(b) by 195 days.

(21) Appl. No.: 12/908,101

(22) Filed: Oct. 20, 2010

(65) Prior Publication Data
US 2011/0102060 A1 May 5, 2011

(30) Foreign Application Priority Data
Oct. 29, 2009 (JP) ................................. 2009-248722

(51) Int. Cl.
*H01C 10/10* (2006.01)
(52) U.S. Cl. .............................. 338/47; 338/99; 338/154
(58) Field of Classification Search ..................... 338/47, 338/99, 154; 200/512, 5 A
See application file for complete search history.

(56) References Cited

U.S. PATENT DOCUMENTS

| | | | | |
|---|---|---|---|---|
| 6,437,682 | B1 * | 8/2002 | Vance | 338/185 |
| 6,653,579 | B2 * | 11/2003 | Inoue et al. | 200/6 A |
| 6,750,408 | B2 * | 6/2004 | Inoue et al. | 200/6 A |
| 6,794,982 | B2 * | 9/2004 | Inoue et al. | 338/47 |
| 7,078,633 | B2 * | 7/2006 | Ihalainen | 200/6 A |
| 7,161,583 | B2 * | 1/2007 | Okada et al. | 345/157 |

FOREIGN PATENT DOCUMENTS
JP      2009-016330        1/2009

* cited by examiner

*Primary Examiner* — Kyung Lee
(74) *Attorney, Agent, or Firm* — Wenderoth, Lind & Ponack, LLP.

(57) ABSTRACT

A resistive sheet includes a flexible cover sheet, a wiring part provided on the bottom face of the cover sheet, and ring, circular-arc, or spiral resistive layer connected to the wiring part. This resistive layer has an uneven bottom face. The resistive sheet also includes a spacer layer whose bottom face is disposed at a position lower than the resistive layer. The wiring part is sandwiched between the bottom face of the cover sheet and the spacer layer.

6 Claims, 13 Drawing Sheets

RESISTIVE SHEET, PRESSURE-SENSITIVE SWITCH, AND INPUT DEVICE

BACKGROUND OF THE INVENTION

1. Field of the Invention

The present invention relates to resistive sheets and pressure-sensitive switches used mainly for operating a range of electronic apparatuses, and to input devices using these resistive sheets and pressure-sensitive switches.

2. Background Art

In response to further advances in the functions and features of a range of electronic apparatuses, such as mobile phones and car navigation systems, resistive sheets, pressure-sensitive switches, and input devices using these sheets and switches that allow simple but wide-ranging operations are in demand for operating electronic apparatuses.

A conventional resistive sheet, pressure-sensitive switch, and input device using the sheet and switch are described below with reference to FIGS. 12 to 14. To facilitate understanding of their structures, dimensions in the thickness direction are enlarged in the drawings.

FIG. 12 is a sectional view, and FIG. 13 is an exploded perspective view of the conventional input device. In FIGS. 12 and 13, substantially dome-shaped movable contact 2 is attached to the bottom face of film over sheet 1 with adhesive (not illustrated).

Film cover sheet 3 is also flexible as over sheet 1. Movable contacts 2 are attached onto cover sheet 3 at five points, which are substantially in the center, and back, front, left, and right from the center, using over sheet 1.

Resistive layer 4 is formed by printing a material with a predetermined surface resistance. Film spacer layer 5 is provided on an area other than portions under movable contacts 2.

Cover sheet 3, and resistive layer 4 and spacer layer 5 on its bottom face configure resistive sheet 6.

Multiple wiring patterns (not illustrated) are formed, typically using copper foil, on the top and bottom faces of film-like or plate-like substrate 7. Semicircular fixed contacts 8A and 8B face each other with a predetermined space in between to configure fixed contact pair 8.

Fixed contact pairs 8 are disposed on substrate 7 at five points, which are substantially in the center, and back, front, left, and right from the center.

Controller 11 includes rated voltage supply 9, resistive element 10, and a microcomputer. Electronic circuit 12 including controller 11 is configured on the top face of substrate 7. Rated voltage supply 9 is connected to fixed contact 8A, controller 11 is connected to fixed contact 8B, one end of resistive element 10 is connected to fixed contact 8B, and its the other end is connected to grounding potential.

Resistive sheet 6 is disposed on fixed contact pairs 8 such that portions of resistive layer 4 not covered with spacer layer 5 face fixed contact pair 8.

Button 14 made of insulating resin is provided on substantially the center top face of rubber sheet 13 made of insulating resin. Operation frame 15 made of insulating resin is provided around button 14. Multiple press parts 13A on the bottom face of rubber sheet 13 contact the top faces of over sheets 1 at the centers of multiple movable contacts 2. Button 14 is disposed in a vertically movable manner and operation frame 15 is disposed in an oscillatable manner on rubber sheet 13 to configure an input device.

In the above structure, as shown in a perspective view of a conventional electronic apparatus in FIG. 14, rubber sheet 13 dents and presses movable contact 2, for example, if position S at the right side of operation frame 15 is pressed downward. Movable contact 2 then resiliently inverts downward with a clicking feedback. This dents resistive layer 4 downward, causing the bottom face of resistive layer 4 to make contact with fixed contacts 8A and 8B. Fixed contacts 8A and 8B are electrically coupled via resistive layer 4.

If further pressing force is applied, the area of resistive layer 4 making contact with fixed contacts 8A and 8B increases, so that resistance between fixed contact 8A and fixed contact 8B decreases.

Controller 11 in electronic circuit 12 formed on the top face of substrate 7 detects this change in resistance as a change in voltage by rated voltage supply 9 and resistive element 10. For example, controller 11 controls the moving direction or moving speed of cursor 19 for selecting from multiple menus 18 displayed on display unit 17 of electronic apparatus 16, such as a mobile phone.

If the upper right corner at position T is pressed, fixed contacts 8A and 8B in fixed contact pairs 8 at the right and back are electrically coupled via resistive layer 4. Controller 11 then moves cursor 19 diagonally upward to the right, and controls the moving speed.

In other words, cursor 19 moves correspondingly to the right if position S to the right edge of operation frame 15 is pressed. Similarly, if position T at the upper right corner is pressed, cursor 19 correspondingly moves to the upper right corner. If the pressing force is increased, cursor 19 moves faster. The electronic circuit controls these display operations.

One conventional art related to the present invention is Japanese Patent Unexamined Publication No. 2009-016330. In the above conventional input device, however, fixed contact pair 8 is provided only at five points: front, back, left, right, and center. Therefore, if a position even slightly to either side of position T is pressed, the timing of movable contact 2 making contact with fixed contact pair 8 deviates. As a result, the balance of the pressing force on each fixed contact pair 8 is poorly reproduced, failing to detect the pressing direction with sufficient accuracy. The cursor thus does not move precisely in the same direction as the pressing direction.

SUMMARY OF THE INVENTION

In the present invention, a resistive layer has a ring, circular-arc, or spiral shape, with an uneven bottom face. This makes it possible to dispose the resistive layer over the entire horizontal face of 360°, at any predetermined angular range. A resistive sheet suitable for detecting the pressing direction can thus be achieved using the resistive layer with a simple structure.

Still more, in the present invention, the resistive layer has a ring, circular-arc, or spiral shape, and an electrode of a thin plate is disposed below a whole area of the resistive layer. This enables reliable detection of the pressing direction. A given pressing direction and width are detectable, and the electrode can be formed of a thin plate. A pressure-sensitive switch suitable for detecting the pressing direction can thus be achieved using the electrode with a simple structure.

Still more, the present invention includes a pressure-sensitive switch, a switch unit connected to the pressure-sensitive switch, a controller connected to the pressure-sensitive switch and the switch unit, and a rated voltage supply. The controller produces a predetermined potential difference between the resistive layer of the pressure-sensitive switch and the electrode of the pressure-sensitive switch by switching the switch unit. The controller estimates the pressing force, in which the resistive layer is being pressed, based on input voltage input to the controller via the electrode of the pressure-sensitive switch. Predetermined voltage distribution in the resistive layer changes in response to a change in the pressing direction. This enables accurate detection of the pressing direction. An input device suitable for detecting the pressing direction can thus be achieved.

Still more, in the present invention, a wire extended from a terminal connected to the electrode of the pressure-sensitive switch is branched, with its one end connected to the controller and the other end connected to grounding potential via a resistive element. The controller estimates the pressing force after a correction step of correcting input voltage input to the controller via the electrode of the pressure-sensitive switch, based on the estimated pressing direction. By correcting a resistive component of the resistive layer generated in accordance with the pressing direction, the percentage of the input voltage, which is input to the controller, corresponding to the pressing force can be identified. This enables accurate detection of the pressing force. An input device suitable for detecting both the pressing direction and the pressing force can thus be achieved.

Moreover, in the present invention, the resistive layer has a ring or circular-arc shape, and an electrode includes an inner electrode and an outer electrode disposed with a predetermined space. The inner electrode has a ring, circular-arc, or spiral inner circumference portion and comb teeth extending outward from the inner circumference portion. The outer electrode includes a ring or circular-arc outer circumference portion and comb teeth extending inward from the outer circumference portion. The comb teeth of the inner electrode and the comb teeth of the outer electrode are alternately disposed. This enables the detection of a given pressing direction and width (difference in radii of the inner circumference portion and the outer circumference portion), and thus reliable detection of the pressing direction. A pressure-sensitive switch suitable for detecting the pressing direction can thus be achieved.

Furthermore, the present invention includes the pressure-sensitive switch, the switch unit connected to the pressure-sensitive switch, the controller connected to the pressure-sensitive switch and the switch unit, and the rated voltage supply. A terminal connected to the resistive layer of the pressure-sensitive switch is connected to the rated voltage supply. The controller estimates the pressing direction, in which the resistive layer is being pressed, based on input voltage input to the controller via the electrode of the pressure-sensitive switch. Predetermined voltage distribution in the resistive layer changes in response to a change in the pressing direction. This enables accurate detection of the pressing direction. An input device suitable for detecting the pressing direction can thus be achieved.

The present invention as described above thus offers a pressure-sensitive switch and an input device employing this pressure-sensitive switch that can detect the pressing force and also accurately detect the pressing direction.

DETAILED DESCRIPTION OF THE INVENTION

Figure 1:
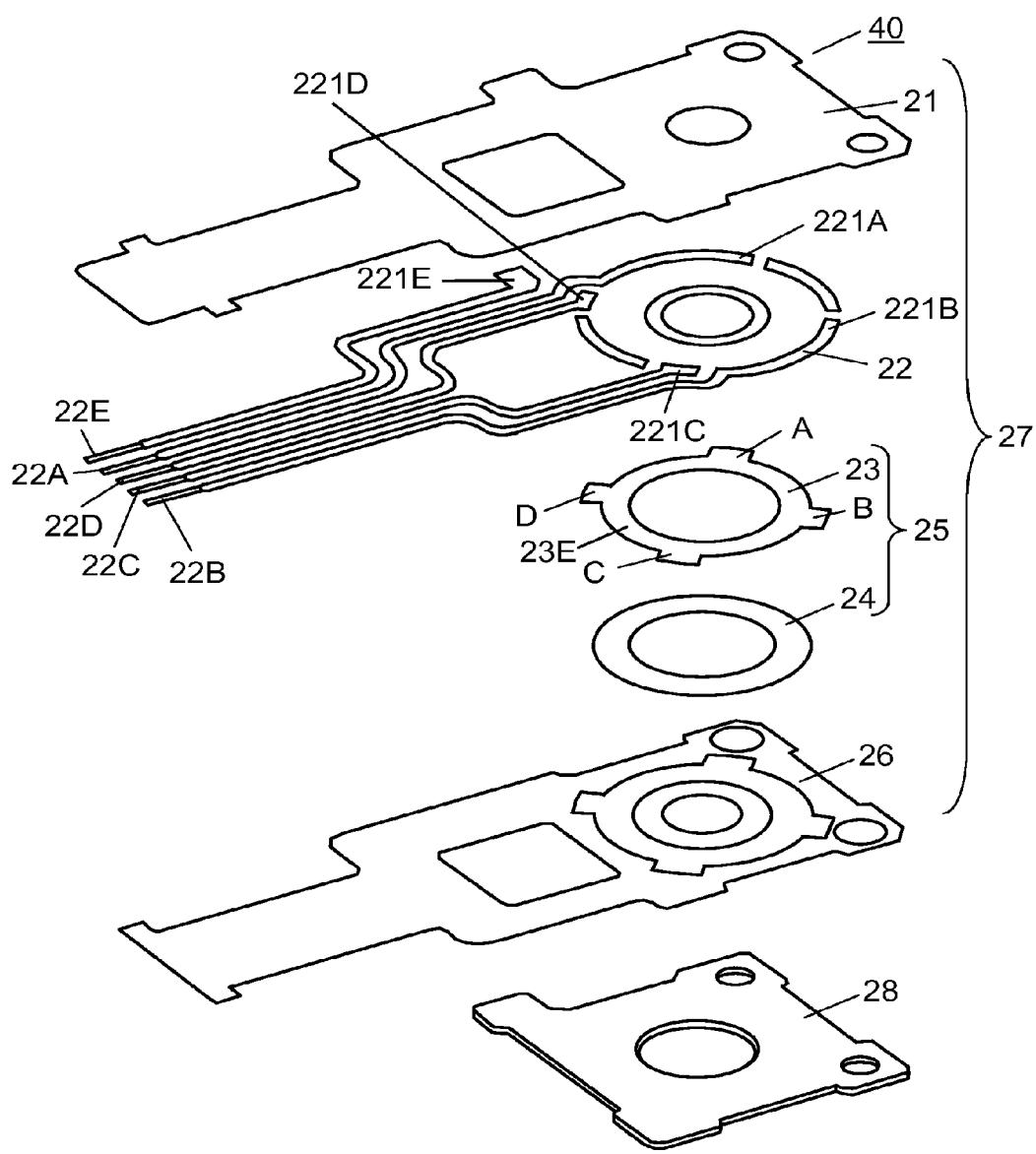
FIG. 1 is an exploded perspective view of a pressure-sensitive switch in accordance with a first exemplary embodiment of the present invention.

Exemplary embodiments of the present invention are described below with reference to FIGS. 1 to 11. Same reference marks are given to structures and components same as that described in the background art to omit duplicate detailed description. To facilitate understanding of their structures, dimensions in the thickness direction are enlarged in sectional views in the drawings.

First Exemplary Embodiment

Figure 2:
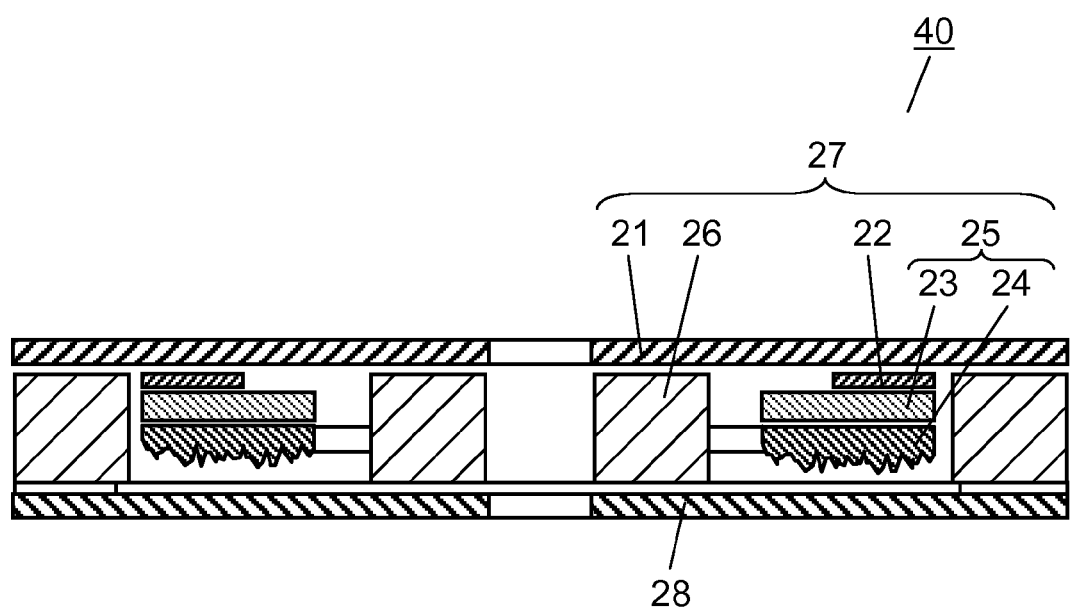
FIG. 2 is a sectional view of the pressure-sensitive switch in accordance with the first exemplary embodiment of the present invention.

FIG. 1 is an exploded perspective view of a pressure-sensitive switch in the first exemplary embodiment of the present invention. FIG. 2 is a sectional view of the pressure-sensitive switch in the first exemplary embodiment of the present invention. In FIGS. 1 and 2, film cover sheet 21 has a round hole at its center, and is made of a flexible material such as polyethylene telephthalate, polycarbonate, and polyimide.

Wiring part 22 is formed of a conductive metal wire, such as copper, and on the bottom face of cover sheet 21 typically by etching. Along the circumference of wiring part 22, four connecting ends 221A to 221D are provided at equal interval. Wiring part 22 extends leftward from each of connecting ends 221A to 221D, and they are connected to terminals 22A to 22D. Wiring part 22 may also be formed by printing conductive ink containing conductive particles, such as silver, as a conductive metal wire.

Wiring part 22 extends leftward from connecting end 221E outside of connecting ends 221A to 221D, and is connected to terminal 22E. Low-resistivity layer 23 is a resistive element formed of synthetic resin with distributed carbon powder. Its sheet resistance is 0.5 k$\Omega$/□ to 30 k$\Omega$/□. Low-resistivity layer 23 is printed in a substantially ring shape on the bottom face of wiring part 22.

Low-resistivity layer 23 includes ring 23E formed in the substantially ring shape, and connecting ends A to D provided at equal interval on the circumference of ring 23E. Connecting ends A to D are connected to connecting ends 221A to 221D of wiring part 22, respectively.

High-resistivity layer 24 has sheet resistance of 50 kΩ to 5 MΩ/□. Its bottom face is finely roughened, and is printed on the bottom face of low-resistivity layer 23. Low-resistivity layer 23 and high-resistivity layer 24 configure resistive layer 25.

Film spacer layer 26 is made of a flexible material such as polyethylene telephthalate, polycarbonate, and polyimide. Spacer layer 26 is attached to the bottom face of cover sheet 21 such that the bottom face of spacer layer 26 is below the bottom face of resistive layer 25. Spacer layer 26 may also be formed by printing insulating ink typically containing epoxy resin.

In other words, wiring part 22 and resistive layer 25 are sandwiched between cover sheet 21 and spacer layer 26. These configure resistive sheet 27.

Substantially square electrode 28 is made of metal conductor, such as stainless steel, and has a round hole at its center. The top face of electrode 28 is flat and smooth.

Spacer layer 26 provides a predetermined space of around 10 to 100 μm between the top face of electrode 28 and the bottom face of resistive layer 25 in resistive sheet 27, configuring pressure-sensitive switch 40.

Connecting end 221E of resistive sheet 27 is connected to electrode 28 via anisotropic conductive paste (not illustrated), and thus terminal 22E of resistive sheet 27 is connected to electrode 28.

Figure 3:
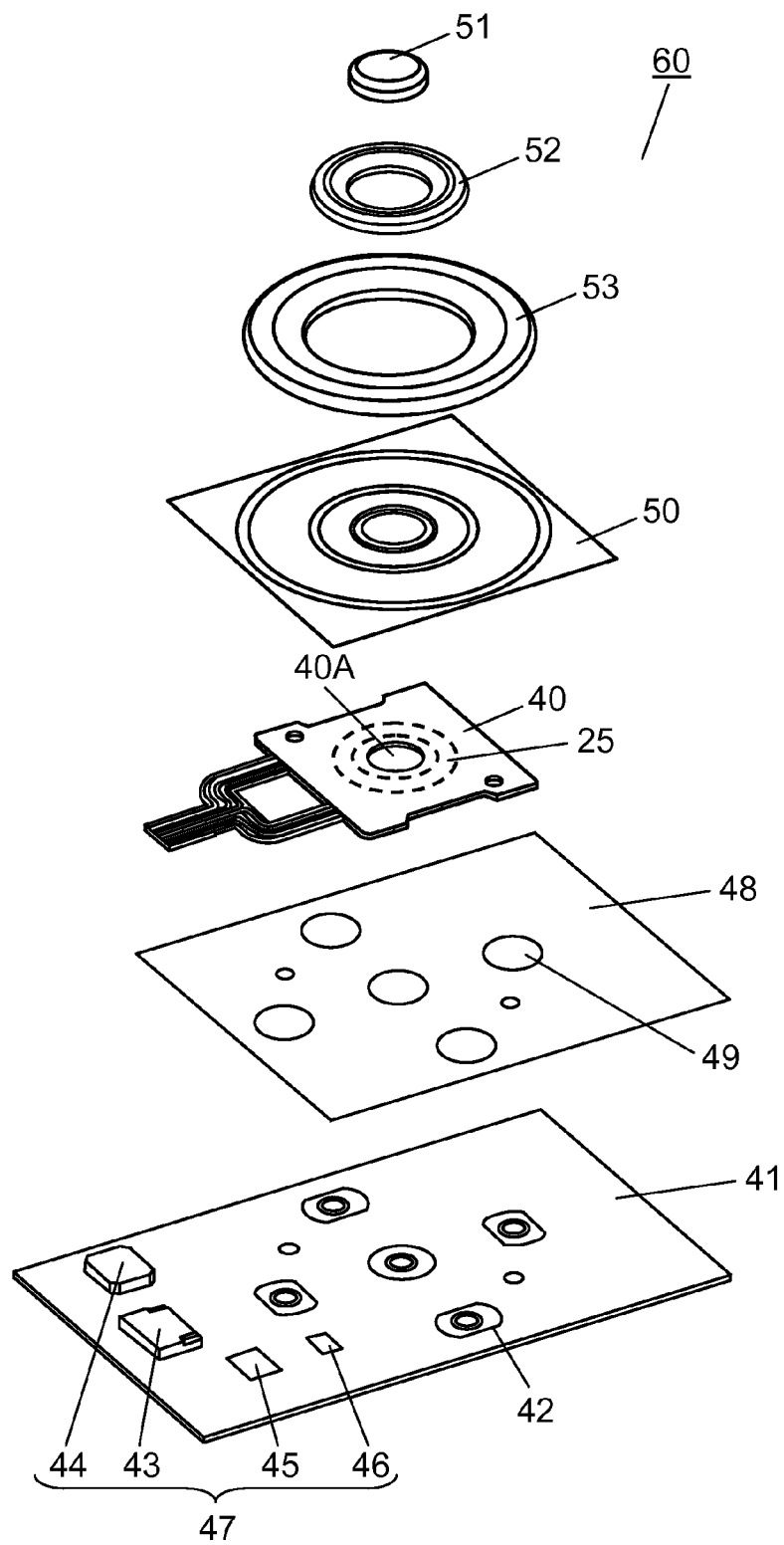
FIG. 3 is an exploded perspective view of an input device in accordance with the first exemplary embodiment of the present invention.

This pressure-sensitive switch 40 is assembled in an electronic apparatus, such as a mobile phone, to configure an input device shown in an exploded perspective view in FIG. 3. In FIG. 3, substrate 41 is a film typically of polyethylene telephthalate or polycarbonate, or a plate typically of paper phenol or glass epoxy. Multiple wiring patterns (not illustrated) are formed typically by copper foil on top and bottom faces of substrate 41.

Fixed contact pair 42, connector 43 made of insulating resin, controller 44, switch unit 45, and resistive element 46 are disposed on the top face of substrate 41. They are connected by each wiring pattern to configure electronic circuit 47. Fixed contact pair 42 includes ring fixed contact and round fixed contact at its center made of conductive metal. Fixed contact pair 42 is provided at five points: front, back, left, right, and center. Controller 44 is formed of a semiconductive element such as a microcomputer. Switch unit 45 is formed of multiple switches that are switchable by signal input from controller 44.

Movable contact sheet 48 includes a light guide sheet made of insulating resin for guiding the light entering from an end face to a predetermined point. This light guide sheet is fixed on the top face of over sheet made of non-conductive resin. Dome-like movable contact 49 made of metal conductor is attached to the bottom face of movable contact sheet 48 at front, back, left, right, and center.

Movable contact sheet 48 is placed on substrate 41 such that movable contacts 49 at front, back, left, right, and center face fixed contact pairs 42 at front, back, left, right, and center on substrate 41. In addition, pressure-sensitive switch 40 is disposed such that the center of round hole 40A created at the center of pressure-sensitive switch 40 comes over fixed contact pair 42 at the center. Terminals 22A to 22E of pressure-sensitive switch 40 are connected to connector 43.

Rubber sheet 50 is made of an elastic material such as silicone and elastomer. Center button 51 made of insulating resin is attached onto the center of rubber sheet 50 with adhesive (not illustrated). Ring pressure-sensitive button 52 made of insulating resin is attached around center button 51, and ring direction button 53 made of insulating resin is attached around pressure-sensitive button 52 onto rubber sheet 50 with adhesive (not illustrated).

Then, pressure-sensitive button 52 is disposed over resistive layer 25 of pressure-sensitive switch 40, direction button 53 over front, back left, and right movable contacts 49, and center button 51 over center movable contact 49. Rubber sheet 50, to which each button is attached, is placed on pressure-sensitive switch 40 to configure input device 60.

Figure 4:
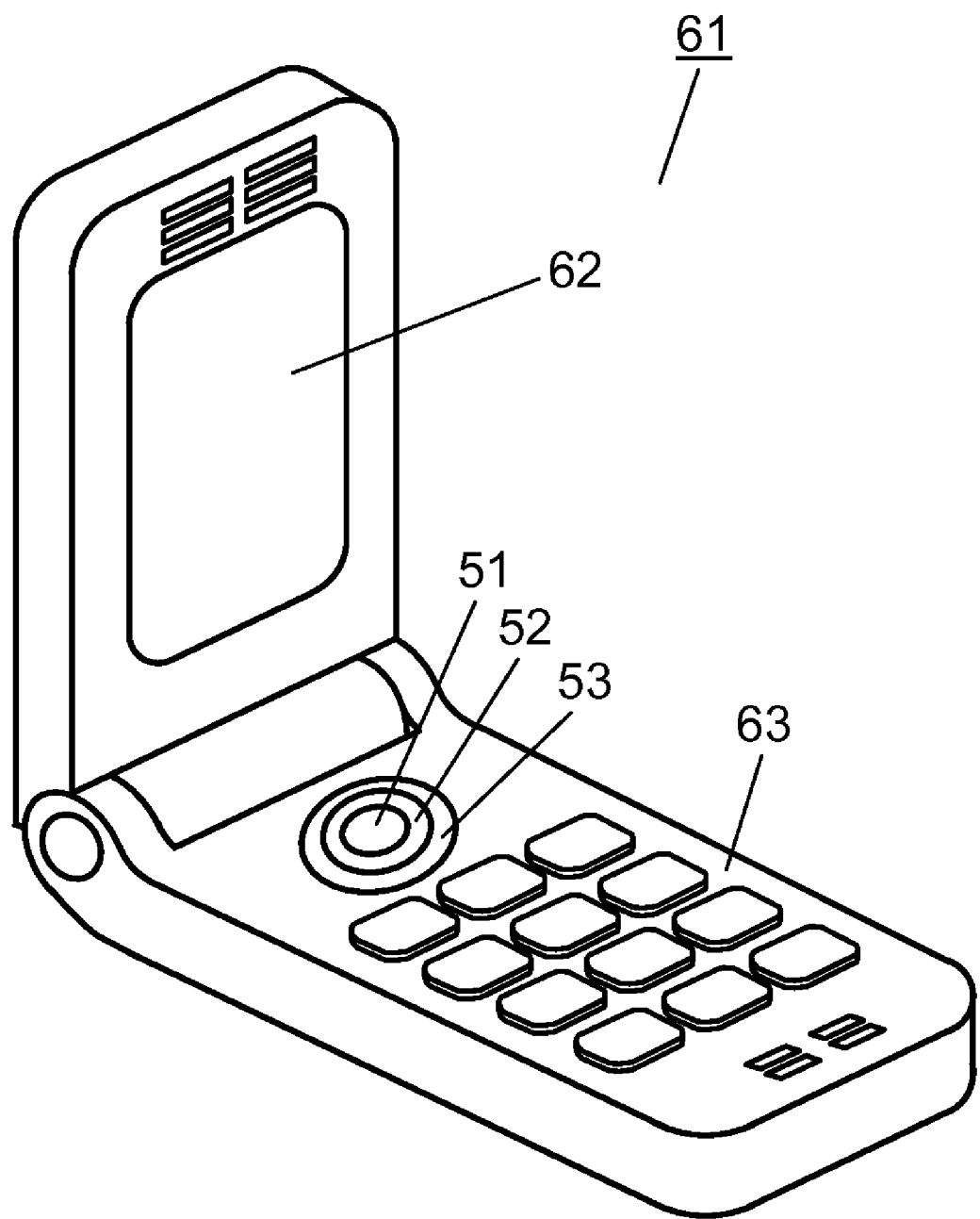
FIG. 4 is a perspective view of an electronic apparatus employing the input device in accordance with the first exemplary embodiment of the present invention.

Input device 60 as configured above is employed in electronic apparatus 61 such as a folding mobile phone shown in a perspective view in FIG. 4. Center button 51, pressure-sensitive button 52, and direction button 53 are disposed on the top face of lower casing 63 facing display unit 62, such as a liquid crystal display element, in an exposed manner so that the user can operate these buttons.

Figure 5:
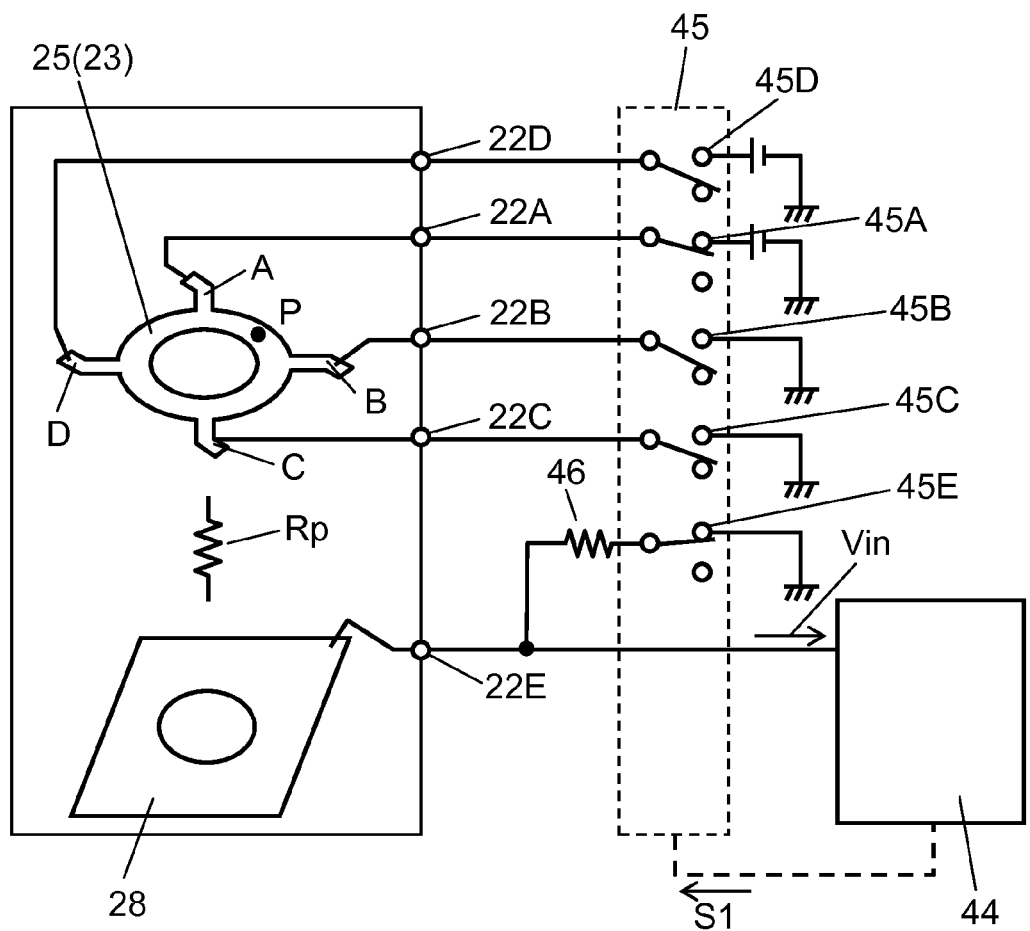
FIG. 5 is a circuit diagram of the input device in accordance with the first exemplary embodiment of the present invention.

Next, electrical configuration of this input device 60 is described with reference to a circuit diagram in FIG. 5. In FIG. 5, terminals 22A to 22D connected to connecting ends A to D of low-resistivity layer 23 in resistive layer 25 are connected to switches 45A to 45D of switch unit 45.

Switches 45A and 45D switch between a state connected to rated voltage supply (e.g., +5V) and an open state. Switches 45B and 45C switch between a state connected to grounding potential (0V) and an open state. In the initial state, switch 45A is connected to rated voltage supply, and switches 45B to 45D are all set to the open state. The rated voltage supply can be between 0.1 V and 30V, and is preferably between 1V and 15V.

Electrode 28 is branched via terminal 22E, with its one end connected to controller 44 so as to input a voltage signal indicated by Vin to controller 44. The other end is connected to switch 45E via resistive element 46. Switch 45E is connected to grounding potential in the initial state.

Switches 45A to 45E are switched based on signal S1 output from controller 44, and voltage signal Vin changes in response to switching results of switches 45A to 45E.

In input device 60 as configured above, a contact area of resistive layer 25 and electrode 28 changes if the user presses point P, for example, on low-resistivity layer 23. This results in changing contact resistance, which is indicated as Rp, between resistive layer 25 and electrode 28.

Controller 44 then estimates the pressing force. Rated voltage supply is applied via switch 45A, and switch 45E is connected to grounding potential. Voltage signal Vin is thus determined by partial pressure ratio between the sum of contact resistance Rp between resistive layer 25 and electrode 28 and line resistance Rap between point A and point P (Rp+Rap), and resistance value R of resistive element 46.

In other words, the controller switches the switch unit to produce a predetermined potential difference between the resistive layer of pressure-sensitive switch and the electrode of pressure-sensitive switch. Therefore, voltage signal Vin corresponding to this potential difference is input to controller 44.

After controller 44 estimates the pressing direction of point P through first to third direction estimating steps, which are described later, controller 44 executes a correcting step of correcting line resistance Rap between point A and point P, and calculates contact resistance Rp between resistive layer 25 and electrode 28.

This correcting step is detailed next. First, controller 44 estimates resistance value of (Rp+Rap) based on a correspondence table, for example, of voltage signal Vin and (Rp+Rap) provided in controller 44.

After controller 44 estimates the pressing direction of point P, Rac×β/α, which is line resistance Rap between point A and point P, is calculated. Here, Rac is a known line resistance between point A and point C, the a degree is an angle corresponding to a circular arc between point A and point C, and the β degree is an angle corresponding to the estimated pressing direction of point P.

Controller 44 then calculates contact resistance Rp by subtracting line resistance Rap between point A and point P from (Rp+Rap), and estimates the pressing force at point P based on a correspondence table, for example, of contact resistance Rp and pressing force.

Next is described sequentially the first to third direction estimating steps.

Figure 6:
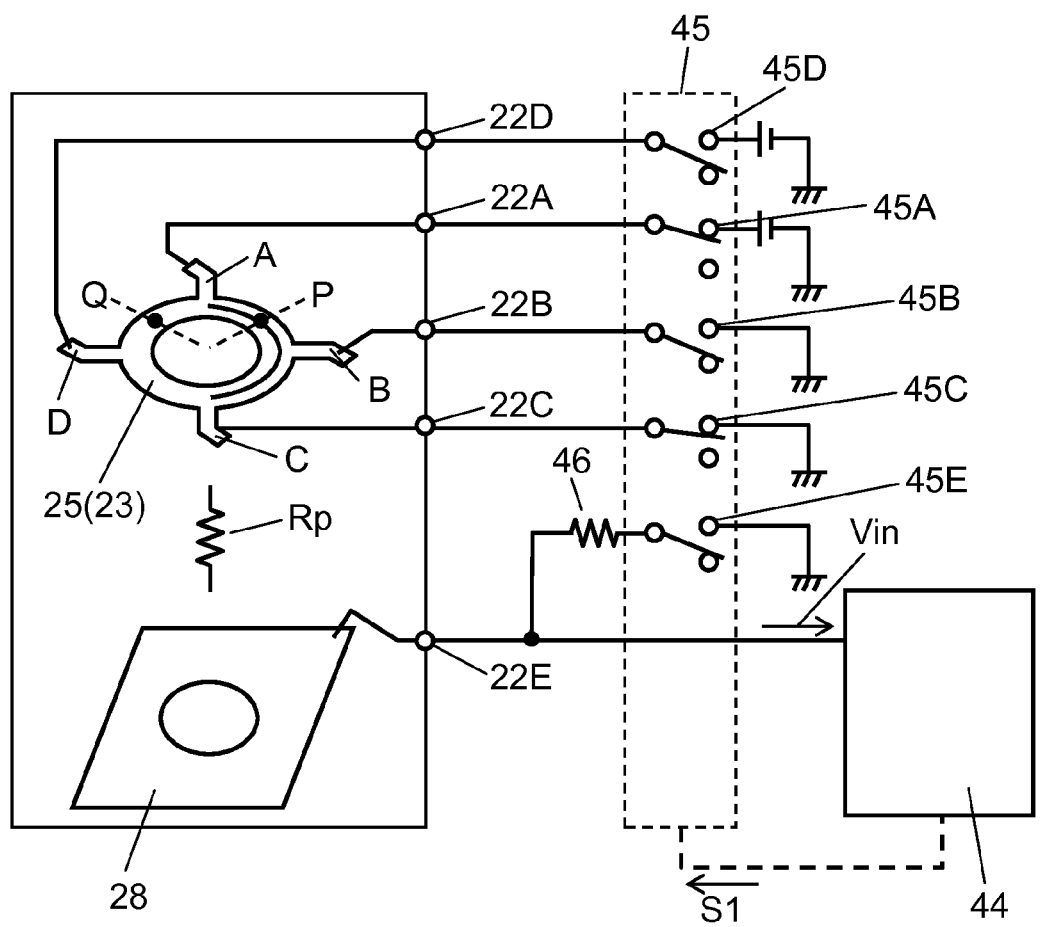
FIG. 6 is a circuit diagram illustrating the operation of the input device in accordance with the first exemplary embodiment of the present invention.

Controller 44 estimates the pressing direction of point P in accordance with the first to third direction estimating steps. In these steps, as shown in FIG. 6, controller 44 uses control signal S1 to switch over switch 45A to the state connected to rated voltage supply from the open state, switch over switch 45C to the state connected to grounding potential from the open state, and switch over switch 45E to the open state.

This makes voltage corresponding to a partial pressure ratio at point P in a route of point A-point P-point C input to controller 44 as input voltage Vin via contact resistance Rp between resistive layer 25 and electrode 28.

Controller 44 estimates the pressing direction based on a correspondence table, for example, of voltage signal Vin and pressing direction provided in controller 44. At this point, controller 44 estimates that the pressing direction is virtual pressing points Q or P that take the same value for voltage signal Vin, since resistive layer 25 has a ring shape (the first direction estimating step).

Figure 7:
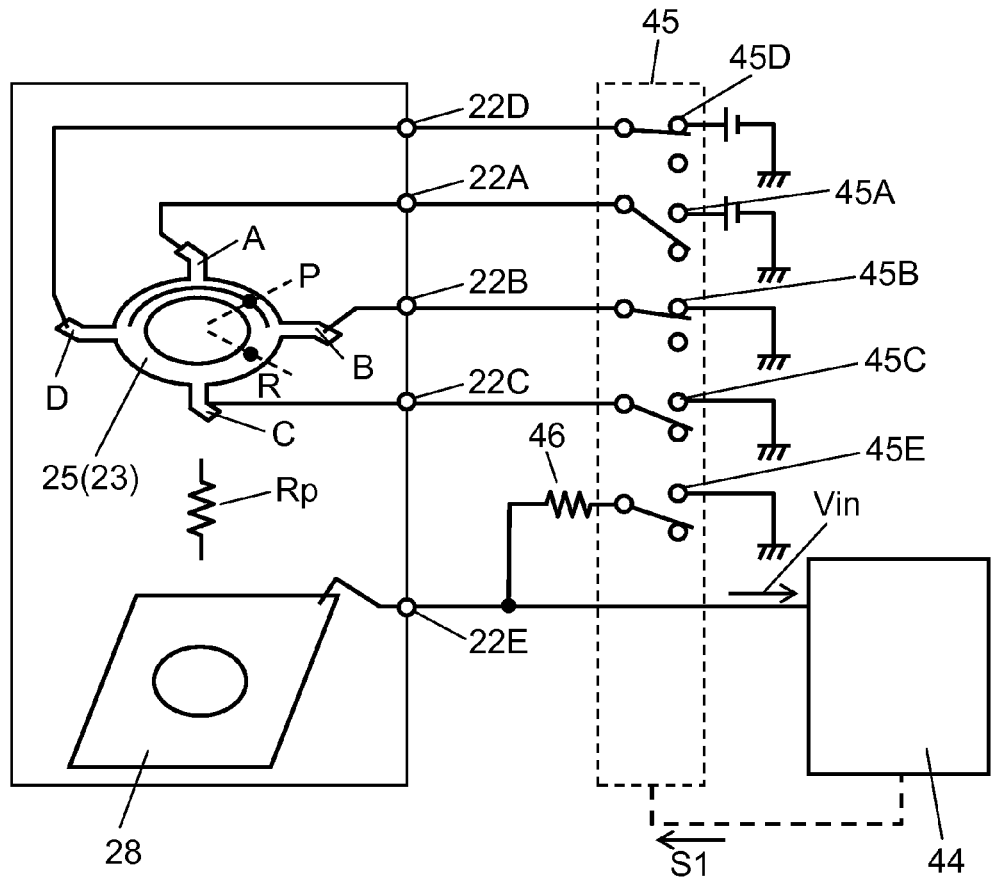
FIG. 7 is a circuit diagram illustrating the operation of the input device in accordance with the first exemplary embodiment of the present invention.

Next, as shown in a circuit diagram in FIG. 7, controller 44 switches over switch 45A to the open state, switch 45B to grounding potential, switch 45C to the open state, and switch 45D to the state connected to rated voltage supply.

This makes voltage corresponding to a partial pressure ratio at point P in a route of point D-point P-point B input to controller 44 as input voltage Vin via contact resistance Rp between resistive layer 25 and electrode 28.

Controller 44 then estimates that the pressing direction is point P or virtual pressing point R based on a correspondence table, for example, of voltage signal Vin and pressing direction provided in controller 44 (the second direction estimating step).

Controller 44 then estimates that the pressing direction is a direction in point P by comparing a result of the first direction estimating procedure and a result of the second direction estimating step (the third direction estimating step).

In other words, controller 44 can estimate the pressing direction by applying voltage to the resistive layer provided with predetermined surface resistance because controller 44 receives input voltage that differs by pressing direction.

Even if multiple routes exist for producing a predetermined potential difference, such as the case of ring resistive layer 25, controller 44 compares the result of first direction estimating step and the result of the second direction estimating step that have different voltage application points. By executing the third direction estimating step of comparing estimation results of pressing direction in both steps, an accurate pressing direction can be determined.

Figure 8:
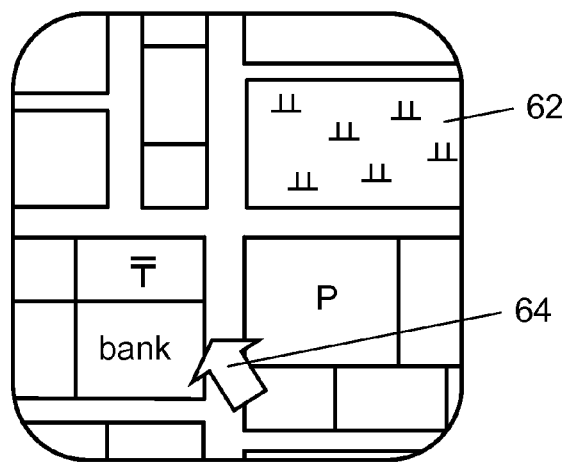
FIG. 8 illustrates a screen of the electronic apparatus employing the input device in accordance with the first exemplary embodiment of the present invention.

For example, as shown in FIG. 8, the map displayed on display unit 62 is considered. Even if a diagonal direction or a direction slightly deviated vertically from that direction is pressed on pressure-sensitive button 52, controller 44 moves a pointer indicated by 64 to a direction intended by pressing the button. If the button is pressed stronger, the movement speed of pointer 64 is increased.

In other words, controller 44 can accurately move the pointer to a direction that the user has operated. In addition, controller 44 changes the movement speed of pointer by estimating the pressing force. Accordingly, highly-flexible and smooth operation becomes feasible.

The above description refers to ring resistive layer 25. However, the present invention is not limited to this shape. A linear resistive layer may also be provided in a circular-arc or spiral shape.

In this case, there is no need to compare the result of the first direction estimating step and the result of the second direction estimating step by changing a voltage application point. A predetermined voltage distribution can be produced in the resistive layer just by connecting both ends of linear resistive layer to different potentials. An accurate pressing direction can thus be estimated based only on the result of the first direction estimating step.

In the above description, controller 44 executes the correcting step at estimating the pressing force. However, the present invention is not limited to this step. Line resistance from a point connected to rated voltage supply to point P where pressed can be reduced by configuring input device 60 such that two or more of connecting ends A to D of resistive layer 25 are connected to the rated voltage supply. Accordingly, controller 44 can estimate the pressing force nearly exactly without executing the correcting step.

In this case, if all four connecting ends A to D are connected to the rated voltage supply, controller 44 can most accurately estimate the pressing force.

As described above, in this exemplary embodiment, ring, circular-arc, or spiral resistive layer has an uneven bottom face, and the resistive layer can be disposed in any angular area of 360° over the entire horizontal. Accordingly, a resistive sheet suitable for detecting the pressing direction can be achieved using the resistive layer with a simple structure.

Still more, the exemplary embodiment refers to the ring or circular-arc resistive layer, and the electrode of a thin plate disposed below a whole area of the resistive layer. This structure enables the detection of a given direction and width pressed by the user. The direction pressed by the user can thus be reliably detected. In addition, since the electrode is a thin plate, a pressure-sensitive switch suitable for detecting the pressing direction can be achieved with a simple structure.

Still more, the exemplary embodiment includes the pressure-sensitive switch, the switch unit connected to the pressure-sensitive switch, the controller connected to the pressure-sensitive switch and the switch unit, and rated voltage supply. The controller switches the switch unit to produce a predetermined potential difference between the resistive layer of the pressure-sensitive switch and the electrode of the pressure-sensitive switch. The controller estimates the pressing direction, in which the resistive layer is being pressed, based on input voltage input to the controller via the electrode of the pressure-sensitive switch. Predetermined voltage distribution in the resistive layer changes in accordance with a change in a direction pressed by the user. The direction pressed by the user can thus be accurately detected. Accordingly, an input device suitable for detecting the pressing direction can be achieved.

Furthermore, the wire extended from the terminal connected to the electrode of the pressure-sensitive switch is branched, with its one end connected to the controller and the other end connected to grounding potential via the resistive element. The controller estimates the pressing force after executing the correcting step of correcting input voltage input to the controller via the electrode of the pressure-sensitive switch based on the estimated pressing direction. By correcting a resistive component in the resistive layer generated in line with the direction pressed by the user, the controller identifies a percentage corresponding to the user's pressing force in input voltage input to the controller. The user's pressing force can thus be accurately detected. Accordingly, an input device suitable for detecting both the pressing direction and the pressing force can be achieved.

Second Exemplary Embodiment

Another exemplary embodiment of the present invention is described with reference to the second exemplary embodiment. The same reference marks are given to structures and components that are the same as in the first exemplary embodiment to omit duplicate detailed description.

Figure 9:
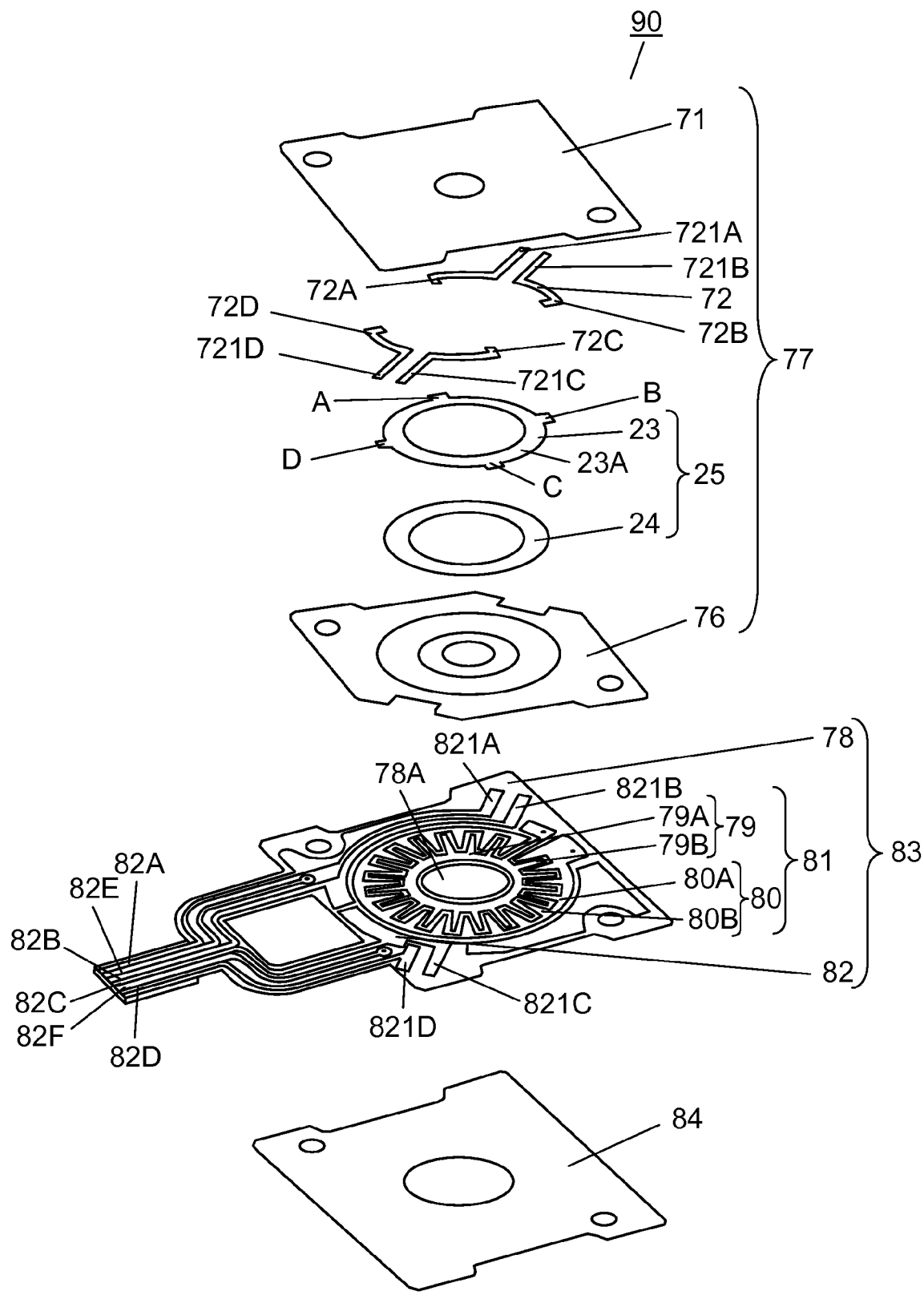
FIG. 9 is an exploded perspective view of a pressure-sensitive switch in accordance with a second exemplary embodiment of the present invention.

FIG. 9 is an exploded perspective view of a pressure-sensitive switch in the second exemplary embodiment of the present invention. In FIG. 9, film cover sheet 71 is formed of a flexible material, such as polyethylene telephthalate, polycarbonate, and polyimide, and a round hole is created at its center.

Wiring part 72 includes a conductive metal wire, such as copper, and is attached to the bottom face of cover sheet 71. Wires circularly extend from inner ends 72A to 72D that are disposed at front, back, left, and right; and other ends of wires extending outward become connecting ends 721A to 721D.

Wiring part 72 may also be formed by printing conductive ink containing conductive particles, such as silver, as conductive metal wires.

Resistive layer 25 includes low-resistivity layer 23 and high-resistivity layer 24. Connecting ends A to D are provided on low-resistivity layer 23. This structure is the same as that of the first exemplary embodiment.

Film spacer layer 76 is formed of a flexible material such as polyethylene telephthalate, polycarbonate, and polyimide. Spacer layer 76 is attached to the bottom face of cover sheet 71 such that its bottom face is below the bottom face of resistive layer 25. Spacer layer 76 may also be formed by printing insulating ink typically containing epoxy resin.

In other words, wiring part 72 and resistive layer 25 are sandwiched between cover sheet 71 and spacer layer 76. They configure resistive sheet 77.

Film base sheet 78 is formed of a flexible material, such as polyethylene telephthalate, polycarbonate, and polyimide, and round hole 78A is created at its center.

Inner electrode 79 of a thin plate of metal conductor, such as copper, is formed typically by etching at substantially the center of base sheet 78. Many comb teeth 79B radically extend outward from ring or circular-arc inner circumference portion 79A.

Outer electrode 80 of a thin plate of metal conductor, such as copper, is formed, typically by etching, outside of inner electrode 79. Many comb teeth 80B extend inward from ring or circular-arc outer circumference portion 80A.

Comb teeth 79B of inner electrode 79 and comb teeth 80B of outer electrode 80 are alternately disposed with a space in between in all directions over the horizontal face (360°) around round hole 78A. Inner electrode 79 and outer electrode 80 configure electrode 81.

Wire 82 formed on the top and bottom face of base sheet 78 extends leftward from inner electrode 79 and outer electrode 80. Inner electrode 79 is connected to a terminal at the left end, indicated as 82F, and outer electrode 80 is connected to a terminal indicated as 82E, respectively.

Through wire 82 formed on the top and bottom faces of base sheet 78, the other ends of terminals 82A to 82D become connecting ends 821A to 821D extending around electrode 81.

Electrode 81 on base sheet 78 and terminals 82A to 82D at the left end and connecting ends 821A to 821D of wire 82 are exposed, and the surface of wire 82 is covered with an insulating layer (not illustrated) to configure electrode sheet 83, which becomes a flexible substrate.

Substantially square bottom cover 84 is made of metal conductor, such as stainless steel, and has a round hole at its center. The top face of bottom cover 84 is flat and smooth.

Electrode sheet 83 is overlaid on the top face of bottom cover 84, and a predetermined space of around 10 to 100 µm is provided by spacer layer 76 between the top face of electrode 81 in electrode sheet 83 and the bottom face of resistive layer 25 in resistive sheet 77. This configures pressure-sensitive switch 90.

Connecting ends 821A to 821D of electrode sheet 83 are connected to connecting ends 721A to 721D of resistive sheet 77 via anisotropic conductive paste (not illustrated), and thus terminals 82A to 82D of electrode sheet 83 are connected to connecting ends A to D of low-resistivity layer 23, respectively.

In other words, pressure-sensitive switch 90 is configured by integrally overlaying resistive sheet 77, electrode sheet 83, and bottom cover 84. Terminals 82A to 82D of electrode sheet 83 are connected to connecting ends A to D of low-resistivity layer 23, terminal 82E to outer electrode 80, and terminal 82F to inner electrode 79.

Figure 10:
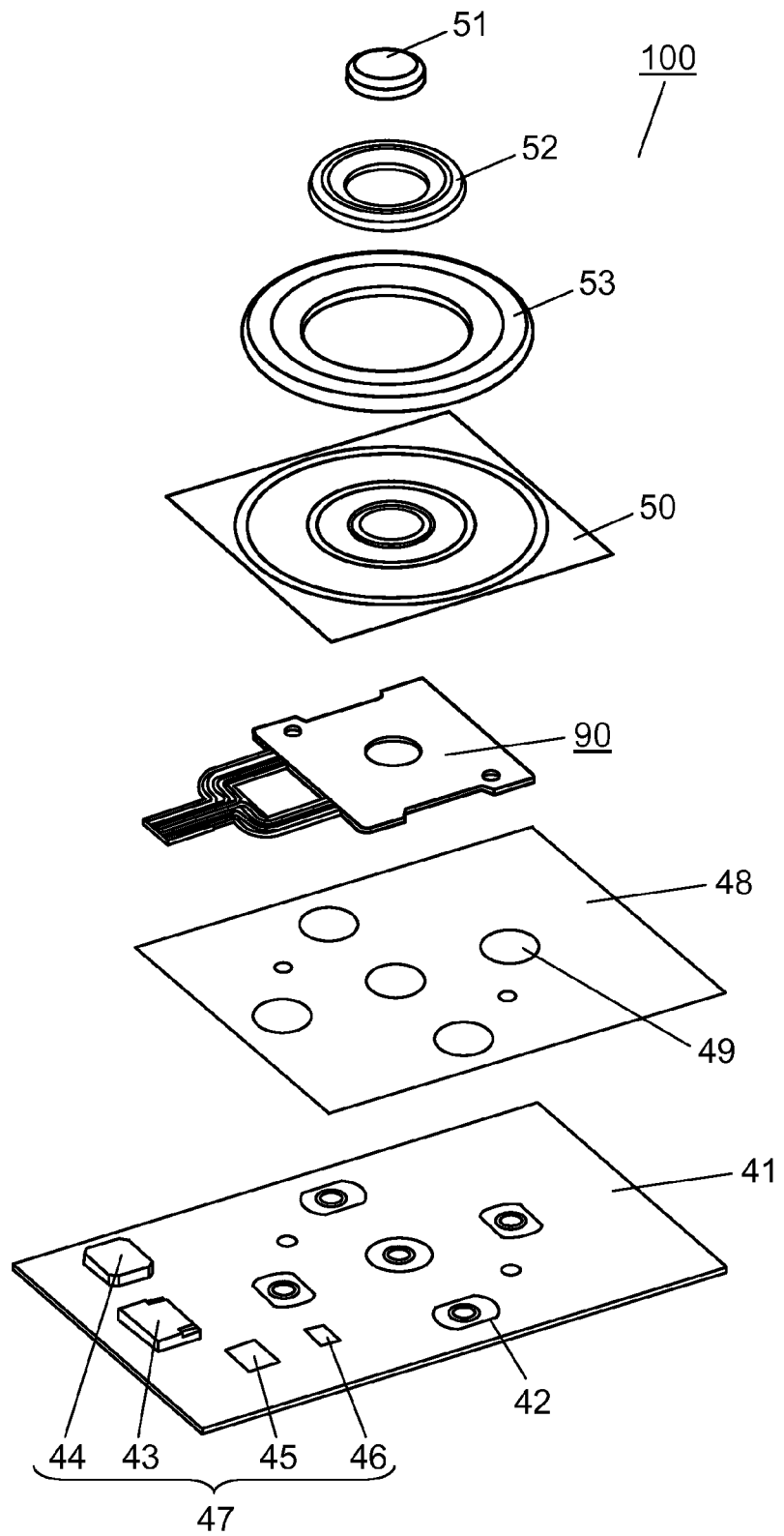
FIG. 10 is an exploded perspective view of an input device.

This pressure-sensitive switch 90 is assembled in an electronic apparatus, such as a mobile phone, to configure an input device 100 shown in an exploded perspective view in FIG. 10. In FIG. 10, fixed contact pair 42, connector 43, controller 44, switch unit 45, resistive element 46, and so on are disposed on the top face of substrate 41 to configure electronic circuit 47. This is the same as the first exemplary embodiment.

Movable contact sheet 48, rubber sheet 50, center button 51, pressure-sensitive button 52, and direction button 53 are also configured in the same way as the first exemplary embodiment. Pressure-sensitive switch 40 in the first exemplary embodiment is replaced with pressure-sensitive switch 90, but other overall configuration of input device 100 is the same as that of input device 60.

Figure 11:
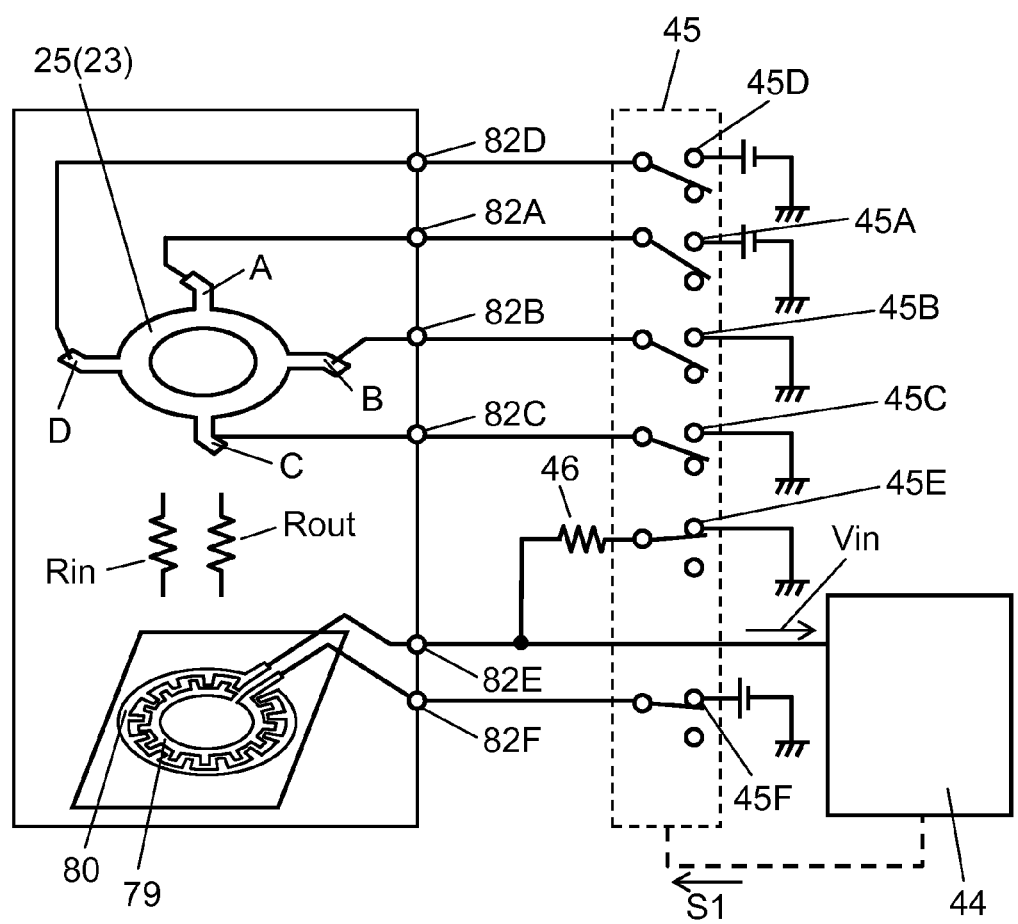
FIG. 11 is a circuit diagram of the input device in accordance with the second exemplary embodiment of the present invention.
Figure 12:
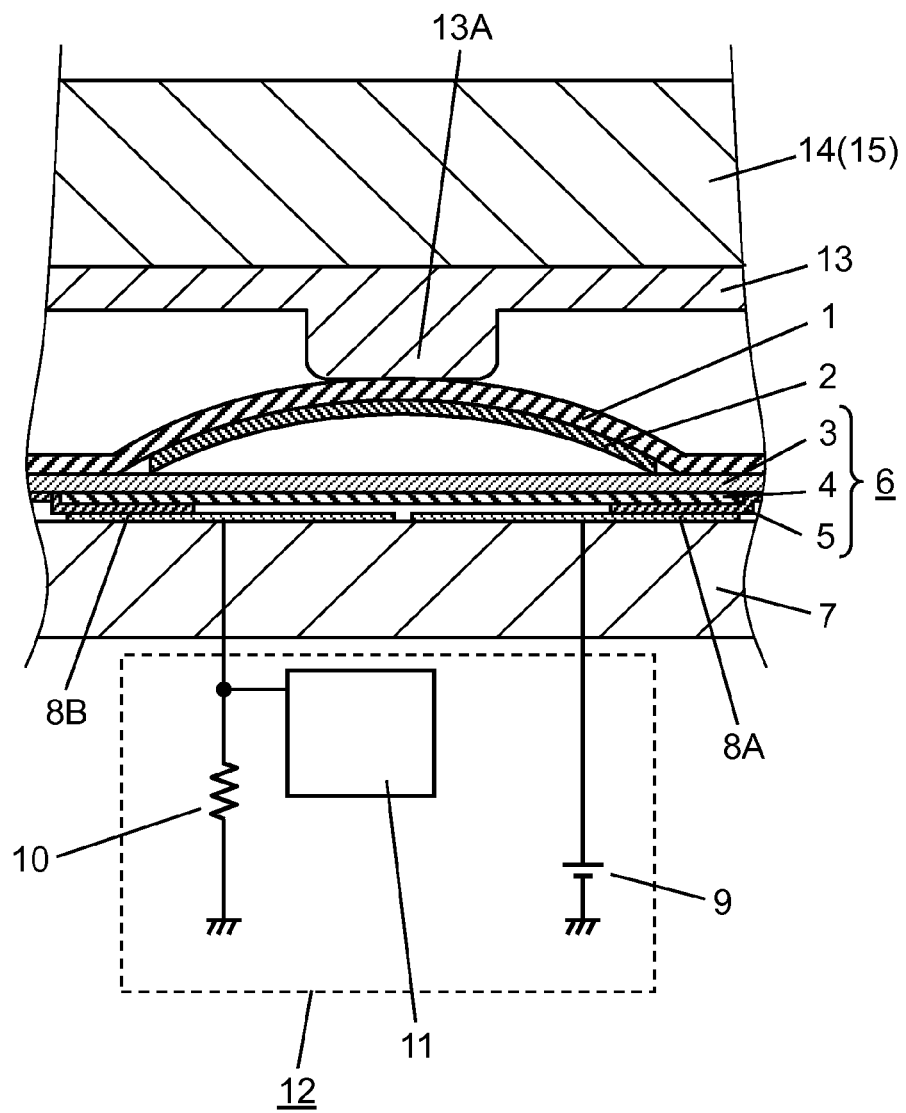
FIG. 12 is a sectional view of a conventional input device.
Figure 13:
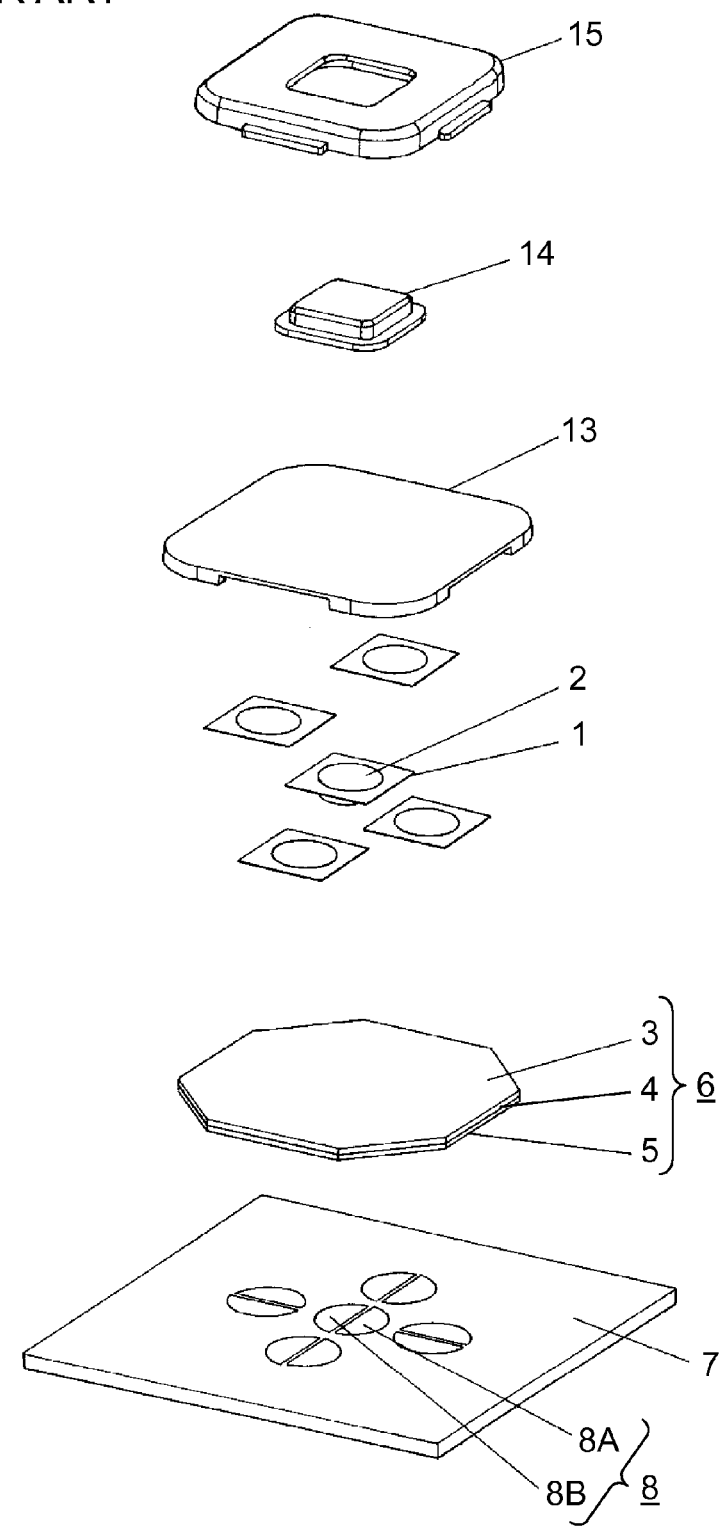
FIG. 13 is an exploded perspective view of the conventional input device.
Figure 14:
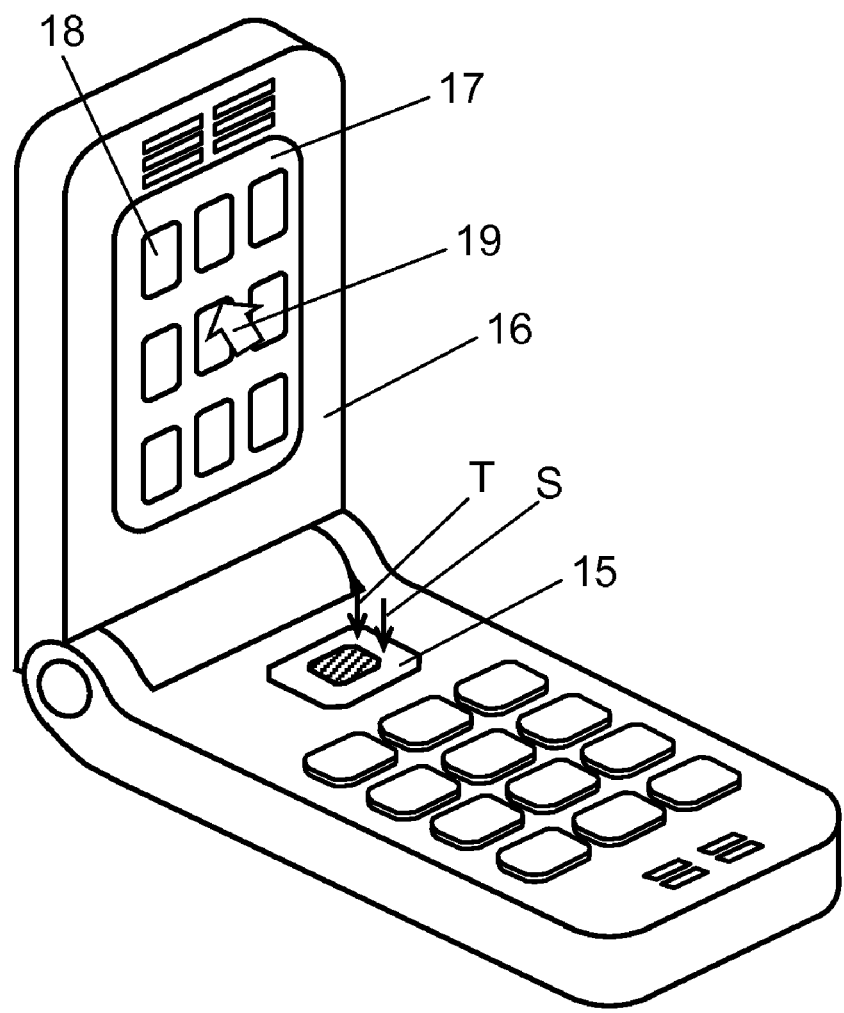
FIG. 14 is a perspective view of an electronic apparatus employing the conventional input device.

Next, electrical configuration of input device 100 is described with reference to a circuit diagram in FIG. 11. In FIG. 11, terminals 82A to 82D connected to connecting ends A to D of low-resistivity layer 23 in resistive layer 25 are connected to switches 45A to 45 D of switch unit 45.

Here, switches 45A and 45D switch between a state connected to rated voltage supply and an open state. Switches 45B and 45C switch between a state connected to grounding potential and an open state. In the initial state, all switches 45A to 45D are set to the open state.

Inner electrode 79 is connected to switch 45F via terminal 82F. Outer electrode 80 is branched via terminal 82E, with its one end connected to controller 44 so as to input a voltage signal indicated as Vin to controller 44. The other end is connected to switch 45E via resistive element 46.

Switch 45E switches between a state connected to grounding potential and an open state, and switch 45F switches between a state connected to rated voltage supply and an open state. In the initial state, switch 45E is set to grounding potential, and switch 45F is set to the state connected to rated voltage supply.

If the user presses point P on low-resistivity layer 23, for example, in input device 100 as configured above, a contact area between resistive layer 25 and inner electrode 79, and a contact area between resistive layer 25 and outer electrode 80 change. This produces a change in contact resistance, which is indicated as Rin, between resistive layer 25 and inner electrode 79; and a change in contact resistance, which is indicated as Rout, between resistive layer 25 and outer electrode 80.

As a result, voltage signal Vin input to controller 44 is determined by a partial pressure ratio proportional to the ratio between a sum of a resistance value of contact resistance Rin between resistive layer 25 and inner electrode 79 and a resistance value of contact resistance Rout between resistive layer 25 and outer electrode 80 (Rin+R out), and resistance value R of resistive element 46.

Then, controller 44 estimates the pressing force at point P pressed by the user based on a correspondence table, for example, of voltage signal Vin and pressing force provided in controller 44.

Voltage signal Vin is close to voltage of rated voltage supply if the pressing force at point P is strong because the resistance value of (Rin+Rout) becomes close to zero. If the pressing force at point P is weak, the resistance value of (Rin+Rout) becomes extremely high, and thus voltage becomes close to zero.

In other words, compared to the input device in the first exemplary embodiment, the input device in the second exemplary embodiment can estimate the pressing force at point P without executing the first to third direction estimating steps and also without the correcting step. Accordingly, steps in controller 44 can be simplified.

The step of estimating pressing direction of point P is the same as that in the first exemplary embodiment. The result of the first direction estimating step and the result of the second direction estimating step, in which voltage is applied to different points, are compared. Then, the third direction estimating step of comparing the estimation results of pressing direction is executed, so as to accurately determine the pressing direction.

In the first exemplary embodiment, controller 44 sets switch 45E to the open state. However, in this exemplary embodiment, both switches 45E and 45F are set to the open state.

The above description refers to ring resistive layer 25. However, the present invention is not limited to this shape. A linear resistive layer may be provided in a circular-arc or spiral shape. This is the same as the first exemplary embodiment.

This exemplary embodiment includes the ring or circular-arc resistive layer, and the inner electrode and the outer electrode are disposed with a predetermined space in between. The inner electrode includes the ring or circular-arc inner circumference portion and the comb teeth extending outward from the inner circumference portion. The outer electrode includes the ring or circular-arc outer circumference portion and the comb teeth extending inward from the outer circumference portion. The comb teeth of the inner electrode and the comb teeth of the outer electrode are alternately disposed. This structure enables the detection of a given direction and width (a difference between radii of inner circumference portion 79A and comb teeth 79B) pressed by the user. The direction pressed by the user can thus be reliably detected. Accordingly, a pressure-sensitive switch suitable for detecting the pressing direction can be achieved.

Furthermore, the exemplary embodiment includes the pressure-sensitive switch, the switch unit connected to the pressure-sensitive switch, the controller connected to the pressure-sensitive switch and the switch unit, and rated voltage supply. The terminal connected to the resistive layer of the pressure-sensitive switch is connected to the rated voltage supply. The controller estimates the pressing direction where resistive layer is pressed based on input voltage input to the controller via the electrode of the pressure-sensitive switch. Since predetermined voltage distribution in the resistive layer changes in accordance with a change in the direction pressed by the user, the user's pressing direction can be accurately detected. Accordingly, an input device suitable for detecting the pressing direction can be achieved.

As described above, the present invention offers the resistive sheet, the pressure-sensitive switch, and the input device using the sheet and switch that can detect the pressing force and also accurately detect the pressing direction. This advantage is effectively applicable to operations of a range of electronic apparatuses.

What is claimed is:

1. A resistive sheet comprising:
   a flexible cover sheet;
   a wiring part including a conductive metal wire, the wiring part being provided on a bottom face of the cover sheet;
   a resistive layer connected to the wiring part, the resistive layer having one of ring, circular-arc, and spiral shapes, and an uneven bottom face; and
   a spacer layer whose bottom face is disposed at a position lower than the resistive layer;
   wherein the resistive layer includes first and second resistive layers, the first resistive layer being disposed on a bottom face of the wiring part, and the second resistive layer being disposed on a bottom face of the first resistive layer, such that the first resistive layer is disposed between the wiring part and the second resistive layer;
   wherein a sheet resistance of the second resistive layer is greater than a sheet resistance of the first resistive layer;
   wherein the second resistive layer has an uneven bottom face; and
   wherein the wiring part is sandwiched between the spacer layer and the bottom face of the cover sheet.

2. A pressure-sensitive switch comprising:
   a resistive layer having one of ring, circular-arc, and spiral shapes;
   a conductive electrode formed of a thin plate, the electrode being disposed below a whole area of the resistive layer with a predetermined space therebetween; and
   a terminal connected to the resistive layer and the electrode;
   wherein the resistive layer is arranged so as to make contact with the electrode upon being pressed, and so that a contact area of the resistive layer and the electrode changes corresponding to the press;
   wherein the resistive layer includes first and second resistive layers, the first resistive layer being disposed on a bottom face of the wiring part, and the second resistive layer being disposed on a bottom face of the first resistive layer, such that teh first resistive layer is disposed between the wiring part and the second resistive layer;
   wherein a sheet resistance of the second resistive layer is greater than a sheet resistance of the first resistive layer; and
   wherein the second resistive layer has an uneven bottom face.

3. An input device comprising:
   the pressure-sensitive switch of claim 2;
   a switch unit connected to the pressure-sensitive switch;

a controller connected to the pressure-sensitive switch and the switch unit; and a rated voltage supply, wherein the controller switches the switch unit to produce a predetermined potential difference between the resistive layer of the pressure-sensitive switch and the electrode of the pressure sensitive switch, and the controller estimates a pressing force of the press on the resistive layer based on input voltage input to the controller via the electrode of the pressure-sensitive switch.

4. The input device of claim 3, wherein a wire extending from the terminal connected to the electrode of the pressure-sensitive switch is branched, with its one end connected to the controller, and another end connected to grounding potential via a resistive element, and the controller estimates the pressing force of the press by a correcting step of correcting the input voltage based on an estimated pressing direction.

5. A pressure-sensitive switch comprising:

a resistive layer having one of ring, circular-arc, and spiral shapes;

a conductive electrode disposed below the resistive layer with a predetermined space; and a terminal connected to the resistive layer and the electrode, wherein the resistive layer makes contact with the electrode by being pressed, and a contact area of the resistive layer and the electrode changes corresponding to the press;

the electrode includes an inner electrode and an outer electrode disposed with a predetermined space in between;

the inner electrode includes one of ring and circular-arc inner circumference portions, and comb teeth extending outward from the inner circumference portion;

the outer electrode includes one of ring and circular-arc outer circumference portions, and comb teeth extending inward from the outer circumference portion; and the comb teeth of the inner electrode and the comb teeth of the outer electrode are alternately disposed.

6. An input device comprising:

the pressure-sensitive switch of claim 5;

a switch unit connected to the pressure-sensitive switch;

a controller connected to the pressure-sensitive switch and the switch unit; and rated voltage supply, wherein a terminal connected to the resistive layer of the pressure-sensitive switch is connected to the rated voltage supply, and the controller estimates a pressing direction in the resistive layer based on input voltage input to the controller via the electrode of the pressure-sensitive switch.

* * * * *